United States Patent [19]

Shapiro et al.

[11] 3,970,965

[45] July 20, 1976

[54] INJECTION LOCKED JOSEPHSON OSCILLATOR SYSTEMS

[75] Inventors: Sidney Shapiro; Charles V. Stancampiano, both of Rochester, N.Y.

[73] Assignee: The United States of America as represented by the Secretary of the Navy, Washington, D.C.

[22] Filed: Mar. 26, 1975

[21] Appl. No.: 562,294

[52] U.S. Cl.............................. 331/107 S; 307/306; 325/445; 331/96
[51] Int. Cl.²........................................... H03B 7/12
[58] Field of Search............... 331/107 S, 96, 107 T; 307/306; 325/445, 446

[56] References Cited
UNITED STATES PATENTS

| | | | |
|---|---|---|---|
| 3,160,826 | 12/1964 | Marcatili | 331/107 T |
| 3,356,866 | 12/1967 | Misawa | 331/96 |
| 3,386,050 | 5/1968 | Dayem et al. | 331/107 S |
| 3,671,848 | 6/1972 | Shapiro et al. | 332/51 W |
| 3,723,755 | 3/1973 | Morse | 331/107 S |

OTHER PUBLICATIONS

McDonald et al., "Harmonic Gen. and Submillimeter Wave Mixing with the Josephson Effect" Applied Physics Letters, 15 Aug. 1969.
Electronics, Longacre, "A Josephson Frequency Converter," Mar. 1, 1971.

*Primary Examiner*—John Kominski
*Attorney, Agent, or Firm*—R. S. Sciascia; L. I. Shrago

[57] ABSTRACT

Various injection locking arrangements employing Josephson oscillators are disclosed for achieving signal amplification, frequency conversion and the detection of extremely low level signals at high frequency ranges.

2 Claims, 4 Drawing Figures

INJECTION LOCKED JOSEPHSON OSCILLATOR SYSTEMS

The present invention relates generally to arrangements employing injection locked Josephson oscillators for accomplishing signal amplification, the detection of extremely low level signals at high frequency ranges and for frequency conversion and mixing purposes.

Injection locking, as is well known, is a process in which an oscillator having a relatively high and relatively broad-band output is frequency pulled and phase locked by a weak, narrow band input signal. The resultant output is at the input frequency, has the narrow bandwidth of this signal and the higher amplitude of the oscillator.

In U.S. Pat. No. 3,671,848, of June 20, 1972, which has as one of its inventors one of the present applicants, there is disclosed a Josephson oscillator consisting of a point contact junction situated in, and strongly coupled to, a co-axial resonator that is, in turn, coupled to a waveguide. When the point contact junction is biased so that its DC voltage is at or near the value $hf_c/2e$, where $f_c$ is the cavity resonant frequency, then the cavity mode is excited by the component of the AC Josephson current which is at the resonant frequency, and the apparatus performs as a free-running RF oscillator. Such an oscillator typically produces about $10^{-11}$W power with a bandwidth of about 50kHz.

When the same junction is irradiated with an external radio frequency signal that has a frequency substantially different from $f_c$, frequency conversion may be accomplished from that of the applied signal to that of the cavity frequency when the junction is biased at certain specified voltages. Thus, the Josephson oscillator can perform as both a local oscillator and mixer to achieve up or down frequency conversion.

According to the present invention, which is concerned with various injection locking arrangements for Josephson oscillators, the Josephson junction is again exposed to either an external source of radio frequency energy or a combination of such sources. In each case, one of these signals behaves as the injected signal and the free-running Josephson oscillator has its frequency pulled to the value of the injected signal frequency.

By operating the Josephson oscillator in the injection locked mode, the noise and mechanical instability of point contact junctions are overcome. Consequently a sharp line oscillation that is stable in time and amplitude may be realized provided the injected signal has these same qualities. With these characteristics the Josephson oscillator becomes a more useful device.

Because of the existence of currents in the Josephson junction, which are at harmonics of the irradiating signal, injection locking can occur when the frequency of the injected signal is near that of the Josephson oscillator or when an harmonic of the signal has this same relationship.

Injection locking can occur when the junction is DC biased to the cavity resonant frequency or effectively DC and RF biased to the sum and difference steps shown in the I-V curve in the above patent. In the latter case, the junction is irradiated with two signals — one, the input signal and the other a comparatively strong radio frequency signal which may be at any frequency outside of the cavity resonance band. The presence of this strong signal results in the formation, as it were, of replicas of the cavity induced step at various positions in the Josephson junction I-V curve. These replicas correspond to the sum and difference steps.

By shifting the bias condition from the cavity induced step and operating at a location on the I-V curve corresponding to a sum step, for example, one may possibly obtain a greater power output and higher efficiency. Likewise, this bias site may permit the junction to operate with substantially higher values of zero-voltage current. Such junctions usually exhibit hysteresis in their I-V curves. By avoiding the region of hysteresis with this combination RF and DC bias one may be able to take advantage of the larger strength of the Josephson effects in such junctions. This too may lead to higher power outputs and more efficient operation.

It is, accordingly, a primary object of the present invention to provide an injection locked Josephson oscillator.

Another object of the present invention is to provide a system for injection locking a Josephson oscillator where the injected signal is either at or near the cavity resonant frequency or at a sub-harmonic thereof.

Another object of the present invention is to provide an injection locked Josephson oscillator system wherein the same Josephson junction serves both as the local oscillator and the mixer in a frequency conversion system.

Another object of the present invention is to accomplish signal amplification, detection or frequency conversion with an injection locked Josephson oscillator.

Other objects, advantages and novel features of the invention will become apparent from the following detailed description of the invention when considered in conjunction with the accompanying drawings wherein.

Figure 1:
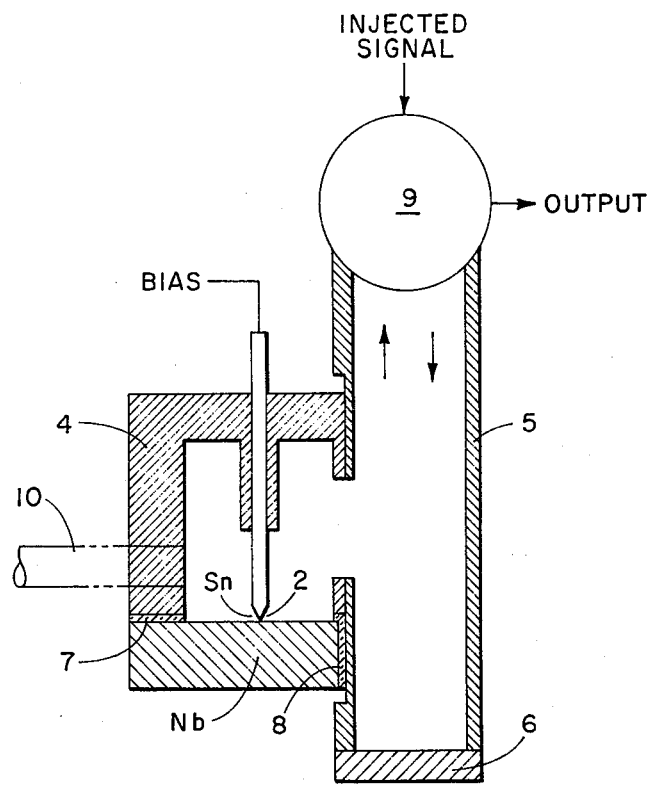
FIG. 1 illustrates one arrangement for injection locking a Josephson oscillator.

Referring now to FIG. 1 of the drawings, it will be seen that a Josephson junction 2 of the point contact type formed by a superconducting tin point in contact with the upper surface of a superconducting niobium element is positioned in the center of a co-axial cavity resonator 4. In this position, there is a good impedance match between the junction and the cavity's dominant TEM mode.

Although not shown, the apparatus includes an appropriate provision for insuring careful control over the contact pressure between both element of the Josephson junction.

A waveguide section 5 closed off at its lower end 6 is secured to the cavity resonator 4 and appropriate sidewall portions of these members are removed to provide aperture coupling therebetween. If desired, a sliding short may be used to terminate the waveguide in order to provide some degree of tuning. The mutual coupling permits an input signal fed into the open end of waveguide 5 to enter cavity resonator 4 and irradiate the Josephson junction. Likewise, it also allows any signal excited in the cavity resonator by the Josephson junction to enter the waveguide for delivery to an external load which may be at room temperature and remote from the junction-cavity system.

Sheets of mica insulation are positioned at locations 7 and 8 so as to insulate the niobium element of the junction from the other conducting components of the assembly.

The entire apparatus, it will be appreciated, is immersed in liquid helium, for example, to establish the superconducting state in the niobium and tin components. Suitable bias for the Josephson junction may be obtained in the usual manner by passing a large measured current through a small accurately known resistance connected in parallel with the Josephson junction.

The Josephson oscillator formed by the above combination of elements may be electrically tuned over a small frequency range by changing the bias conditions or mechanically tuned over a large frequency range by adjusting the cavity resonant frequency and then re-establishing a proper bias across the junction. Consequently, it is capable of generating oscillations over a very wide range of frequencies extending within the millimeter and submillimeter range regions.

Applicants have found that this type of Josephson oscillator may also be injection locked. Thus, in the arrangement of FIG. 1, if an input signal at frequency $f_i$ is fed to the waveguide section 5, the free-running Josephson oscillator output at $f_o$ will be pulled to the input signal frequency provided this frequency is within a locking range $\Delta f_L$ of $f_o$. As a result of this injection locking, the output signal also present in waveguide 5 will have the frequency and bandwidth of the input signal and the amplitude of the free-running Josephson oscillator. Hence, if it is desired to utilize the arrangement of FIG. 1 as part of an amplifier or detector, all that is necessary is that the signal, which is to be processed, be fed into the system as the injected signal, that the resonant frequency $f_c$ of cavity 4 be made equal or nearly equal to this frequency and that the Josephson junction be properly DC biased in accordance with the expression $V = hf_c/2e$. Since the input signals are at the same frequency, a conventional circulator 9 or a directional coupler can be attached to waveguide 5 to separate these signals.

Figure 2:
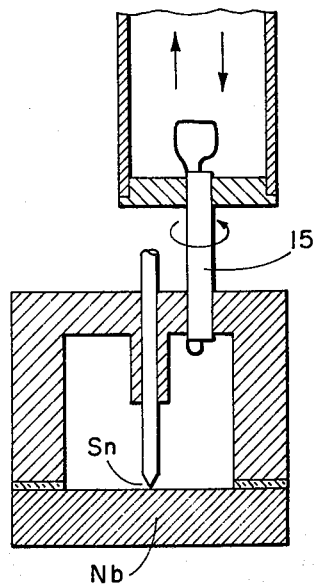
FIG. 2 shows an alternative system for accomplishing this injection locking.

FIG. 2 shows an alternative arrangement where a section of rigid co-axial line 15, terminated at each end with loops, links the waveguide section at the cavity resonator. By rotating the co-axial loop assembly, smooth adjustments in the amount of coupling can be realized.

The full benefit of the above behavior of the Josephson oscillator is realized when the externally applied signal is highly stable in frequency and has a substantially narrower bandwidth than the free-running Josephson oscillator. This type of signal can be derived from, for example, a solid-state microwave diode source having a bandwidth of about 1kHz.

Normally, the frequency of the Josephson oscillator follows changes in the applied DC voltage produced by adjusting the bias circuit conditions. Where injection locking is desired, approximate current control bias may be utilized, and the junction voltage adjusts to changes in this bias current as determined from the junction's I-V curve. The frequency of the Josephson oscillator in the absence of an input signal is adjustable over a range of about 5MHz under usual operating conditions as the bias current is adjusted along the cavity-induced current step. However, in the presence of an injected signal, there is a small range of bias current over which the Josephson oscillator frequency is not changed. Rather, it is synchronized, that is, phased locked to the injected signal and operates only at the signal frequency. This phase lock condition requires that the junction DC voltage remain fixed, hence, there must be a tiny zero slope current step induced by the injected signal in that part of the cavity induced step in the I-V curve where the locked oscillator frequency falls. Applicants have observed this frequency pulling over a range of input signal frequencies and for a variety of input signal power levels. One important characteristic of an injection locked oscillator is that $P_o$, the output power, may be much larger than $P_i$, the injected signal power level. Applicants have observed this effect by monitoring the reflected signal from a junction-cavity termination and have measured gains of as much as 70 dB. This gain translates to an injected signal level of only $10^{-17}$W.

Another characteristic of the injection locked oscillator that has been observed, is appreciable bandwidth narrowing of the output in the locked condition over that of the free-running oscillator. In one case, the locked output bandwidth was about 1kHz, i.e., the bandwidth of the injected signal, whereas the free-running Josephson oscillator bandwidth was typically 50kHz; a narrowing of a factor of 50.

Since the Josephson oscillator produces an extremely low level of power, which may be less than $10^{-10}$W, only extremely low values of injected power, as previously noted, are needed to establish the phase lock mode. Hence, the system is extremely sensitive, and this sensitivity persists throughout the frequency range of the oscillator.

The injection locked Josephson oscillator, above described, can perform as a local oscillator for a separate mixer stage. When so used, a stable and narrow-band output may be obtained by employing as the input signal a signal derived from a simple and inexpensive external solid-state source, whose frequency is multiplied to the higher values of interest by high order harmonic generation in, for example, an appropriate semiconductor diode before being directed onto the junction. The extremely low power level needed for locking of the Josephson oscillator permits this type of input signal processing. The direct generation of these frequencies would involve complex and expensive circuits, especially in the higher frequency regions.

The frequency multiplication, mentioned above, which takes place external to the Josephson oscillator, can be avoided by employing an injected signal which is a sub-harmonic of the desired local oscillator frequency. This mode of operation is possible since a Josephson junction irradiated with an RF signal has AC currents flowing through it which correspond to all of the harmonics of this signal.

In the sub-harmonic locking mode, the input signal has a frequency $f_i$ selected such that $nf_i$, where $n$ is some integer, lies within the locking range of $f_o$, the free-running Josephson oscillator frequency. The Josephson junction is biased onto the cavity-induced step so as to oscillate free-running at $f_o$. The harmonic generation from $f_i$ to $nf_i$ takes place in the junction and the cavity is resonant at $f_c$ which is at or near $nf_i$.

In this sub-harmonic locking mode, where $n$ might be as large as 10, a separate input transmission line would bring the signal, $f_i$, into the Josephson junction and a separate output transmission line would remove the output locked signal at frequency $nf_i$. In this regard, waveguide 5 in FIG. 1 could serve as one line but a second waveguide, such as 10 in communication with the interior of the cavity, would have to be added to the assembly. Waveguide 10 in this Figure, which may have any appropriate cross-section, has smaller dimensions than waveguide section 5 since it carries the higher frequency signal, $nf_i$. A suitable aperture may be formed in the side wall of cavity 4 for accepting one end of this waveguide and so allow signal coupling between it and the interior of the cavity. When this second waveguide 10 is required as part of the over-all apparatus of FIG. 1, circulator 9 may be eliminated since only one signal, $f_i$, will then be present within waveguide section 5. This modified arrangement would not, of course, require the circulator 9.

In the systems described above, the Josephson junction is biased on a cavity-induced step. If a strong RF signal at a frequency well above or well below that of $f_c$ is introduced into cavity 4 via waveguide 10, for example, so that the Josephson junction is irradiated with this signal and $f_i$ injection locking can occur with the junction biased to any of the sum and difference steps which appear on the I-V curve and are replicas of the cavity-induced step. The output signal will again be frequency pulled to $f_i$. However, by operating at these steps the possible advantages, mentioned hereinbefore which have to do with higher power output and efficiency may be realized.

Figure 3:
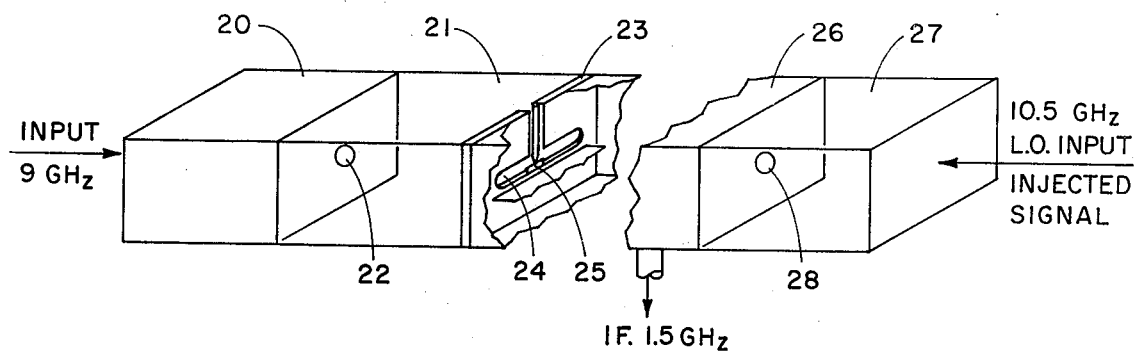
FIG. 3 shows an injection locked Josephson oscillator operating as a combined local oscillator and mixer.

FIG. 3 illustrates an arrangement where an injection locked Josephson oscillator performs both as a local oscillator and a mixer for frequency conversion purposes. Here, a signal that is to be detected, $f_i$, which may be at 9GHz, for example, is fed to a section of waveguide 20 which is coupled by an iris 22 to a first rectangular TE mode high Q-cavity 21. A second waveguide section 27, having a 10.5GHz local oscillator locking signal fed thereto is also iris coupled to a second adjacent rectangular TE mode high Q-cavity 26. Cavity 21 is used only for matching the 9GHz input signal to the Josephson junction 25, while cavity 26 is used for injection locking the local oscillator signal. Junction 25, which in this case is biased on the cavity induced step caused by cavity 26 must now interact strongly with both this cavity and 21. This is accomplished by locating the junction within a shallow capacitative slot 24 formed in a thin flange 23 which serves as a common rear wall to both of these cavities.

As so far described, the apparatus constitutes an injection locked Josephson oscillator at about 10.5GHz, with the junction biased onto the corresponding cavity-induced step, plus means for coupling to this junction, a signal which is to be detected. Although there is an injection locked output signal at the local oscillator frequency leaving waveguide section 27, this signal is not utilized in the mixing operation. Rather, the local oscillator currents directly produced in the junction itself which are stable because of the locking process are used. These currents mix with the currents that are also there because of the input signal at 9GHz and their interaction results in the presence of various AC currents at a number of combination frequencies. Since the function of the apparatus is to provide an IF signal, the junction must also be coupled to a third resonance at this difference frequency.

Figure 4:
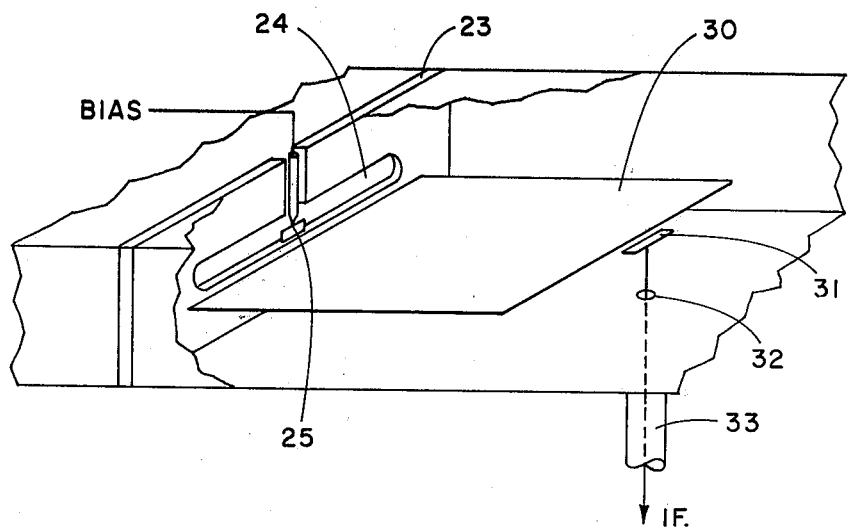
FIG. 4 is an enlarged view of the Josephson junction area of FIG. 3.

As best seen in FIG. 4, which is an enlarged view of the Josephson junction 25 area, the desired resonance near 1.5GHz, the IF frequency, is achieved by a quarter wave resonant stub formed as a thin metallic "tongue" 30 inside cavity 26. This "tongue" forms the inner lead of a flattened co-axial resonator which has as its outer lead, adjacent top and bottom wall portions of the rectangular cavity. The IF resonator is about a quarter wavelength long, with an open circuit at one end and a short circuit at the other. This short circuit is due to the presence of the conducting flange 23 which supports it in a cantilever manner. Thus, the junction is tightly coupled to three different resonators at the input signal, local oscillator and IF frequencies.

Co-axial line 33, which serves as the output for the IF signal is coupled to the IF resonator by a capacitative antenna probe 31 positioned near the open end of tongue 30. A suitable aperture 32 is formed in the bottom wall of cavity 26 for permitting passage of the inner conductor of co-axial line 33 which forms part of this probe.

Because of the locking process, the IF signal, as indicated previously, is stable and narrowband provided the 9GHz signal also has these qualities. By the same token the noise and the effects of junction instability are also suppressed. As a result, the IF signal accurately reproduces the signal which is being detected except that it is scaled down in frequency.

It will be appreciated that the systems shown in FIGS. 1 and 2 are illustrative and that the objects of invention enumerated above can be obtained with other arrangements of junctions, cavities and transmission lines.

What is claimed is:

1. A mixer comprising, in combination a first rectangular waveguide cavity resonant at a frequency $f_i$,
said first waveguide cavity having one end wall with an aperture formed therein for coupling electromagnetic wave energy into said first cavity;
a second rectangular waveguide cavity resonant at a frequency $f_c$,
said second waveguide cavity having one end wall with an aperture formed therein for coupling electromagnetic wave energy into said second cavity,
said first and second cavities sharing a common second end wall,
said common end wall having a capacitive slot formed therein at a location intermediate the top and bottom walls of said waveguide cavities;
a Josephson junction positioned within said slot and biased with a DC voltage equal to $hf_c/2e$;
means for coupling an input signal of frequency $f_i$ to said first cavity and a mixing signal of a frequency which is at or near $f_c$ to said second cavity,
said mixing signal injection locking the Josephson oscillator formed by said Josephson junction and said second cavity; and
an output resonator formed in part by said common wall and portions of the walls of said second rectangular waveguide that are adjacent thereof for extracting a signal from said second waveguide cavity whose frequency corresponds to the difference in frequency of $f_i$ and $f_c$.

2. In an arrangement as defined in claim 1 wherein said output resonator includes
a conducting plate secured in a cantilever manner to said common wall at a location below said capacitive slot,
said plate being parallel to the top and bottom walls of said second waveguide cavity and extending into said second cavity a distance equal to ¼ wavelength of the difference frequency between $f_i$ and $f_c$.

* * * * *